US005728596A

United States Patent [19]

Prall

[11] Patent Number: 5,728,596

[45] Date of Patent: Mar. 17, 1998

[54] METHOD FOR FORMING A SEMICONDUCTOR BURIED CONTACT WITH A REMOVABLE SPACER

[75] Inventor: Kirk D. Prall, Boise, Id.

[73] Assignee: Micron Technology, Inc., Boise, Id.

[21] Appl. No.: 733,506

[22] Filed: Oct. 18, 1996

Related U.S. Application Data

[63] Continuation of Ser. No. 285,335, Aug. 2, 1994, Pat. No. 5,605,864.

[51] Int. Cl.[6] .................................................. H01L 21/8242

[52] U.S. Cl. ...................... 437/52; 437/195; 148/DIG. 20

[58] Field of Search .............. 437/195, 52; 148/DIG. 20

[56] References Cited

U.S. PATENT DOCUMENTS

| | | |
|---|---|---|
| 5,051,380 | 9/1991 | Maeda et al. . |
| 5,223,448 | 6/1993 | Su . |
| 5,422,315 | 6/1995 | Kobayashi . |

FOREIGN PATENT DOCUMENTS

| | | |
|---|---|---|
| 60-22340 | 4/1985 | Japan . |
| 3-248429 | 6/1991 | Japan . |

*Primary Examiner*—Jey Tsai

*Attorney, Agent, or Firm*—Trask, Britt & Rossa

[57] ABSTRACT

A removable oxide spacer is used to reduce the size of a contact opening in a DRAM cell between polysilicon word lines below a lithographic minimum. The removable spacer is deposited before the buried contact patterning and etching. Since word lines diverge at a cell location, the removable spacer retains a lesser thickness over the divergent area contact opening and a greater thickness elsewhere between word lines due to the more narrow gap therebetween and the spacer being deposited such that if fills the gap. The removable spacer reduces the buried contact size since the actual self-aligned contact area is defined by the spacer sidewall. Etching of the spacer creates a buried contact opening smaller than lithographic minimum because silicon oxide surrounding the buried contact area is protected by the removable spacer. The removable spacer is removed after resist strip leaving a sublithographic buried contact opening.

21 Claims, 6 Drawing Sheets

80 50 82 84 OXIDE OXIDE 88 76 WSIX WSIX POLY POLY FOX N+ N+ 86 76

FIG. 4A
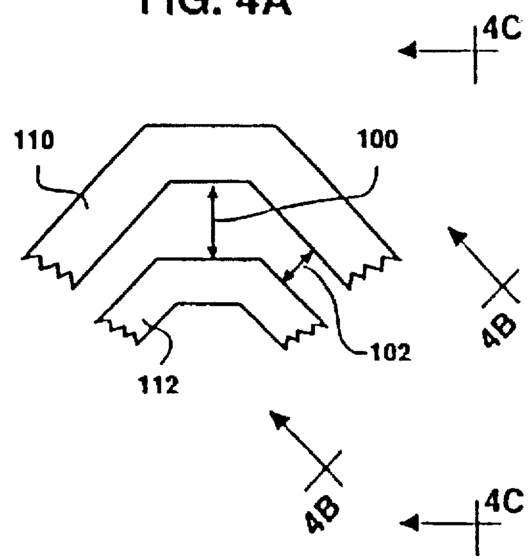
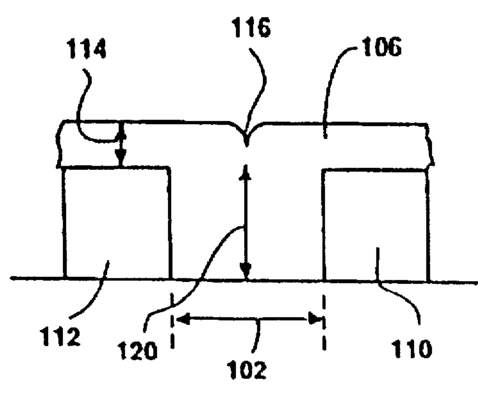
FIG. 4B
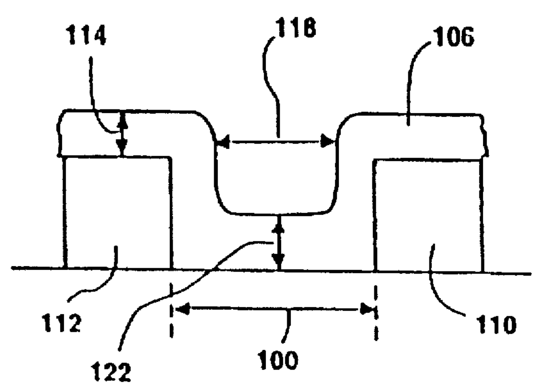
FIG. 4C

METHOD FOR FORMING A SEMICONDUCTOR BURIED CONTACT WITH A REMOVABLE SPACER

This is a continuation of application Ser. No. 08/285,335, filed Aug. 2, 1994, U.S. Pat. No. 5,605,864.

TECHNICAL FIELD

This invention relates, in general, to a method of forming a buried contact in a semiconductor wafer substrate. More particularly, a sublithographic contact is formed using a removable spacer.

BACKGROUND OF THE INVENTION

In Dynamic Random Access Memory (DRAM) technology wherein a capacitor is used as a storage element, it is necessary to connect the access transistor active area to the capacitor bottom plate (storage plate). This connection is known as a buried contact, i.e., other layers or elements are above the contact surface. Typically, buried contacts are no smaller than the lithographic minimum associated with patterning the wafer.

It is the purpose of this invention to reduce the size of this contact surface for the following reasons: the cell area may be reduced; the capacitor storage plate registration alignment is improved; the soft error rate is improved since there is a smaller buried contact area that intercepts alpha particles; the subthreshold voltage characteristics are improved by moving the buried contact edge away from the access transistor; and it is possible to form the contact as self-aligned in both directions so a single large rectangular mask can be used to etch a plurality of buried contacts.

SUMMARY OF THE INVENTION

According to principles of the present invention in its preferred embodiment, a removable spacer, such as ozone tetraethyl orthosilicate ($O_3$TEOS), is used to reduce the size of a contact opening between polysilicon word lines below a lithographic minimum. The removable spacer is deposited before patterning and etching of a buried contact.

Since word lines diverge at the location of a DRAM cell where a buried contact exists, the removable spacer is deposited so that it does not completely fill the gap created by the divergence of the word lines, but does fill more narrow gaps at other locations between the word lines. In essence, the divergent area comprises a lesser amount of spacer TEOS than other, more narrow gap areas between the word lines. Accordingly, during etching, the etchant penetrates the lesser amount of TEOS at the buried contact area to create the sublithographic buried contact, but does not penetrate other areas where a thicker layer of TEOS has filled in the narrow gaps between word lines.

The removable spacer reduces the buried contact size since the actual self-aligned contact area is defined by the spacer sidewall. An opening smaller than lithographic minimum is etched because silicon oxide surrounding the buried contact area is protected by the removable spacer. The removable spacer is removed after resist strip leaving a small buried contact opening.

The invention generally described is a method of forming a buried contact on a semiconductor wafer, the method comprising:

- forming a plurality of vertical transistor gate structures on a substrate;
- depositing an insulator layer over and adjacent the gate structures and substrate;
- depositing a removable spacer layer over the insulator layer;
- patterning the buried contact area in the removable spacer layer;
- etching the removable spacer layer and the insulator layer to form the buried contact;
- etching the removable spacer layer to remove the removable spacer; and
- completing fabrication of the wafer.

Other objects, advantages, and capabilities of the present invention will become more apparent as the description proceeds.

BRIEF DESCRIPTION OF THE DRAWINGS

FIG. 4A is a plan view of a DRAM cell showing divergent and minimum word line widths for deposition of the removable spacer of the present invention.

FIG. 4B is a section view taken along lines 4B—4B of FIG. 4A.

FIG. 4C is a section view taken along lines 4C—4C of FIG. 4A.

DETAILED DESCRIPTION OF THE INVENTION

Figure 1C:
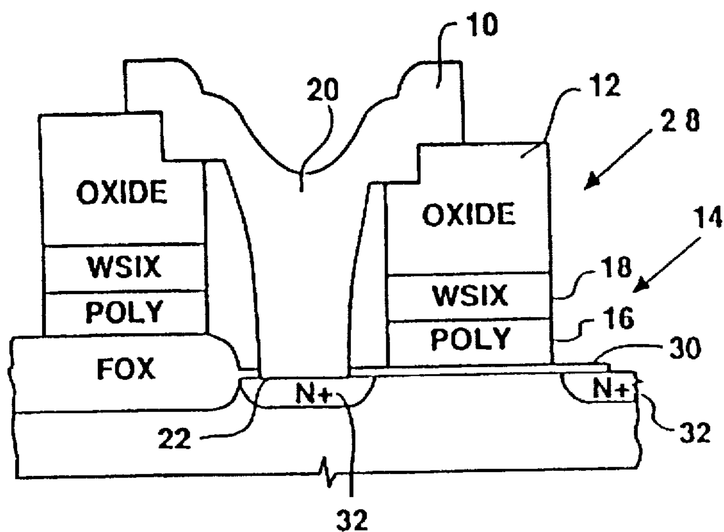
FIG. 1C is a section elevation taken along lines 1C—1C of FIG. 1A (prior art).
Figure 1B:
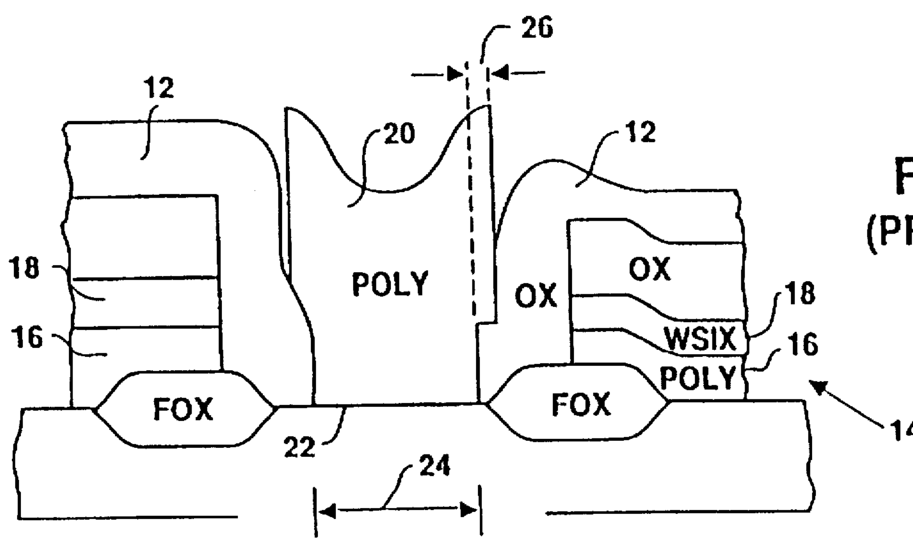
FIG. 1B is a section elevation taken along lines 1B—1B of FIG. 1A (prior art).
Figure 1A:
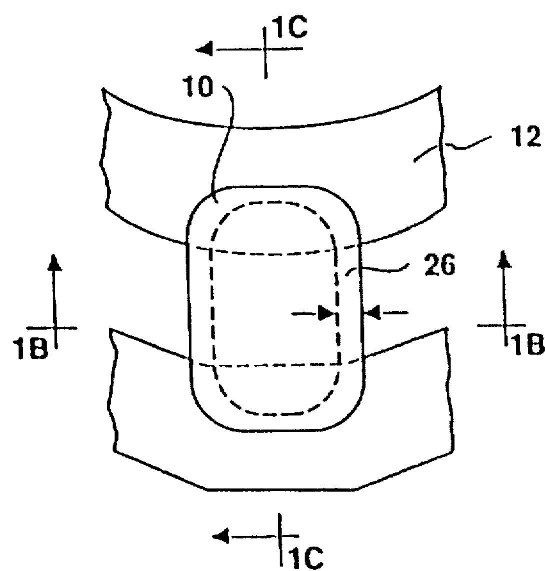
FIG. 1A is a plan view of a DRAM cell (prior art).

FIGS. 1A–C depict a buried contact 22 in the prior art. This prior art is shown in order to more fully recognize the value and novelty of the present invention wherein a sublithographic buried contact is formed. Polysilicon capacitor plate 10 covers oxide layer 12 and word line 14. Word line 14 comprises polysilicon 16 and tungsten silicide 18 ($WSi_x$).

In section view FIG. 1B, polysilicon bottom plate 20 forms the relatively large buried contact at 22 having a width 24, substantially the photolithographic minimum. The overlap, dimension 26, sometimes called the registration budget, is kept minimal because it directly contributes to cell size.

DRAM transistor 28 can be seen in cross-section FIG. 1C with the polysilicon and $WSi_x$ above gate oxide 30. Active areas 32 are adjacent the gate. Buried contact 22 is the surface below patterned capacitor storage or bottom plate 20.

Figure 2C:
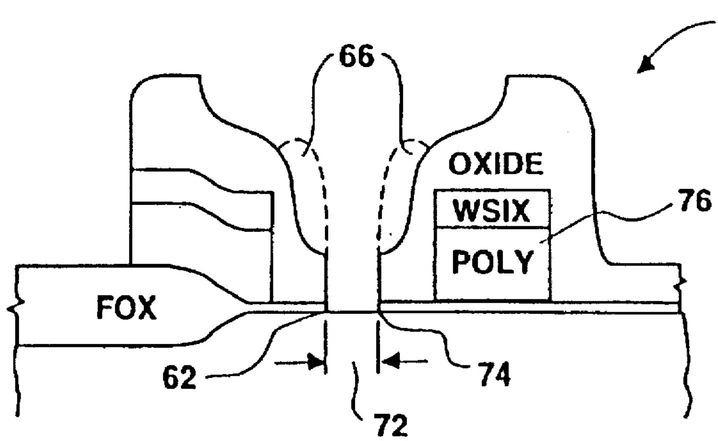
FIG. 2C is a section view taken along lines 2C—2C of FIG. 2A.
Figure 2B:
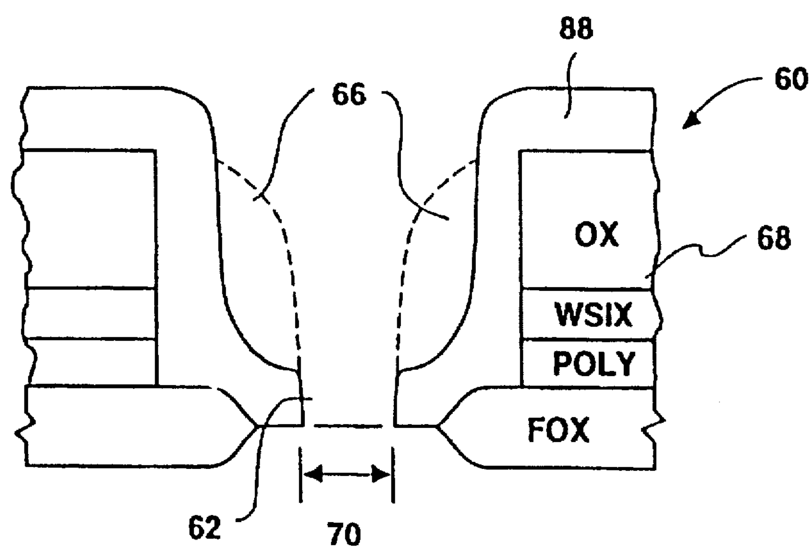
FIG. 2B is a section view taken along lines 2B—2B of FIG. 2A.
Figure 2A:
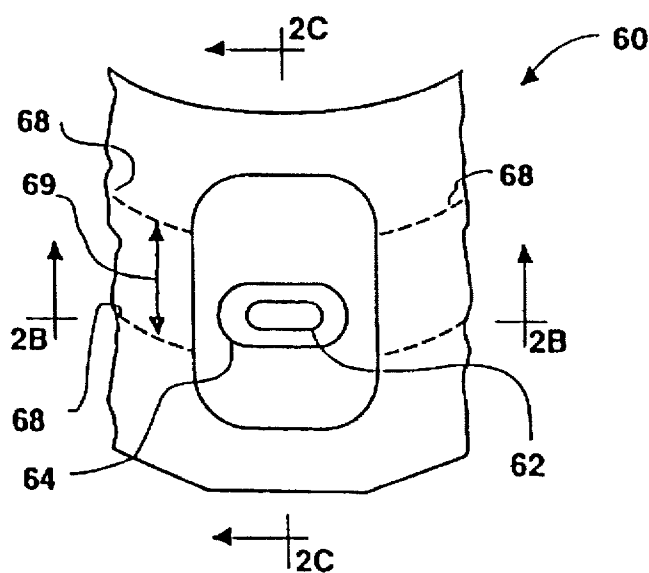
FIG. 2A is a plan view of a DRAM cell buried contact of the present invention.

Referring now to FIGS. 2A–C, a sublithographic buried contact is shown as formed according to principles of the present invention. FIG. 2A is a plan view of a single memory cell 60. Inner oval 62 is the sublithographic contact opening formed by using a removable spacer according to principles of the present invention. Larger oval 64 represents the area surrounding contact opening 62 that is masked by the removable spacer for actual etching of contact opening 62. The edges of two adjacent word lines 68 (in phantom since they are buried) are separated from each other at substantially the lithographic minimum 69 and communicate with buried contact opening 62.

FIG. 2B is a section view taken along lines 2B—2B of FIG. 2A. Phantom lines 66 represent the removable spacer that has been removed but that was previously deposited in order to etch sublithographic contact opening 62. Dimension 70 is sublithographic and represents the size of buried contact opening 62.

FIG. 2C is a section view taken along lines 2C—2C of FIG. 2A. Dimension 72 is also sublithographic and represents the size of contact opening 62 as viewed from this cross-section. This sublithographic dimension improves subthreshold voltage characteristics since buried contact edge 74 is a greater distance from access transistor 76.

Figure 3A:
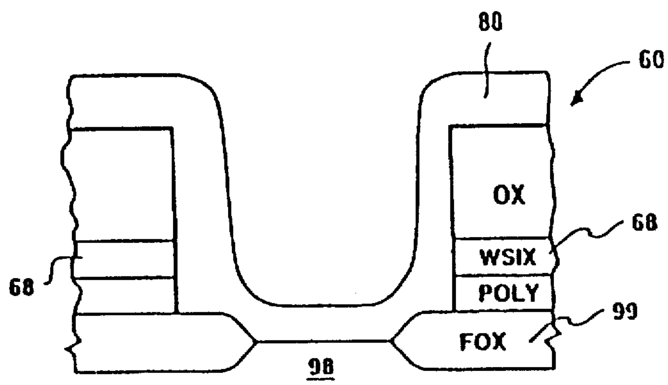
FIGS. 3A–3D are section views of the steps involved in the present invention process for forming a sublithographic buried contact as shown in FIG. 2B.

FIGS. 3A–D are section views of the steps involved in the present invention process for achieving a sublithographic buried contact as shown in FIG. 2B. FIG. 3A depicts how a plurality of vertical transistor word lines 68 have been formed on substrate 98 and field oxide layer 99, and insulator layer 88 ($O_3$TEOS oxide) is deposited over and adjacent the gate structures and substrate.

Figure 3B:
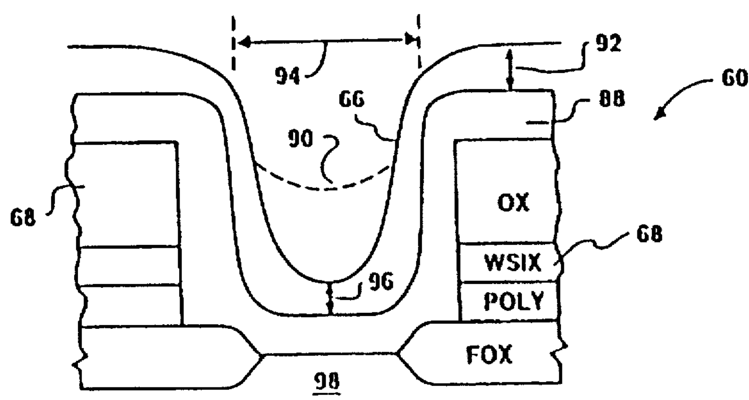
Figure 3C:
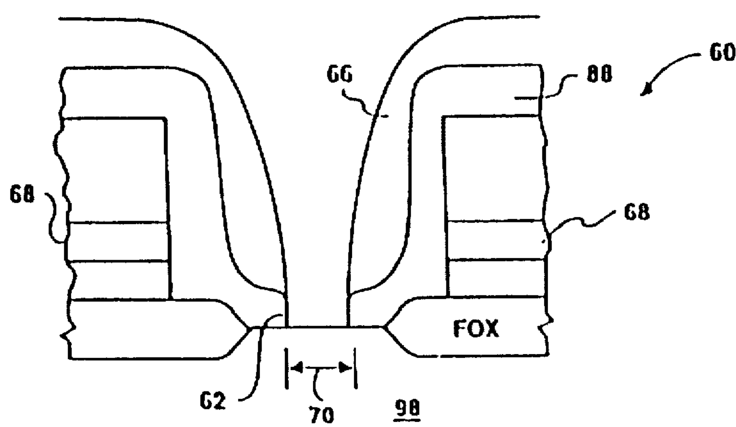

FIG. 3B depicts how removable spacer layer 66 is subsequently deposited over insulator layer 88. Spacer layer 66 is deposited at a thickness 92 of less than ½ the distance between the two adjacent word lines (gate structures 68) as measured at a minimum width point defined elsewhere along the word lines (not shown). In this diagram, word lines 68 are separated by a divergent gap distance 94 that is greater than the minimum distance elsewhere separating the word lines. Distance 94 is greater because at a cell location the width between word lines increases to accommodate the cell.

When spacer layer 66 is deposited at a thickness of substantially ½ the distance measured at the minimum width point, any gap that is existing at that minimum width point is substantially filled in by the spacer layer. However, since gap 94 is greater than the minimum gap, gap 94 is not substantially filled in by spacer layer 66. Rather, spacer layer 66 has a thickness 96 at the bottom of the cell, which is less than the thickness that exists at the minimum width point (not shown) that has been filled in by the spacer layer. Phantom line 90 depicts how gap 94 would be filled in too much if the spacer layer was deposited too thick.

To clarify this concept further, refer now to FIGS. 4A–C for a moment. In FIGS. 4A–C the distinction between the deposition of the spacer layer where word lines diverge at a cell location and the deposition at a minimum width area of the word lines is more clearly defined. Specifically, FIG. 4A represents two adjacent word lines 110 and 112 having a divergent width 100 at a location where the word lines communicate with a DRAM cell and buried contact location. FIG. 4A also depicts minimum width 102 elsewhere between word lines 110 and 112.

FIG. 4B shows how thickness 114 of spacer layer 106 is deposited at substantially ½ the thickness of width 102, thereby causing gap 116 to be essentially filled in with the spacer layer 106. In contrast, FIG. 4C shows how spacer layer 106, although deposited at substantially the same thickness 114, does not completely fill in gap 118 because divergent width 100 is larger than minimum width 102 (FIG. 4A).

Accordingly, when etching occurs, a contact is etched through spacer layer 106 in divergent width 100 of FIG. 4C, but a contact is not etched through minimum width 102 in FIG. 4B, because spacer layer 106 has a thickness 120 associated with minimum width 102 that is greater than thickness 122 associated with divergent width 100.

Referring back now to FIGS. 3A–D, buried contact opening 62 of FIG. 3C is depicted having sublithographic measurement 70 after spacer layer 66 and insulator layer 88 have been anisotropically etched. Elsewhere along word lines 68 at the previously described minimum distance gap point, any etching that has occurred will not have penetrated completely through the spacer layer at that point because the gap is filled by the spacer layer more so than at the buried contact area (see FIGS. 4A–C). Consequently, etching connects through to substrate 98 at buried contact opening 62, but does not connect through elsewhere at the minimum gap point(s) along word lines 68.

Figure 3D:
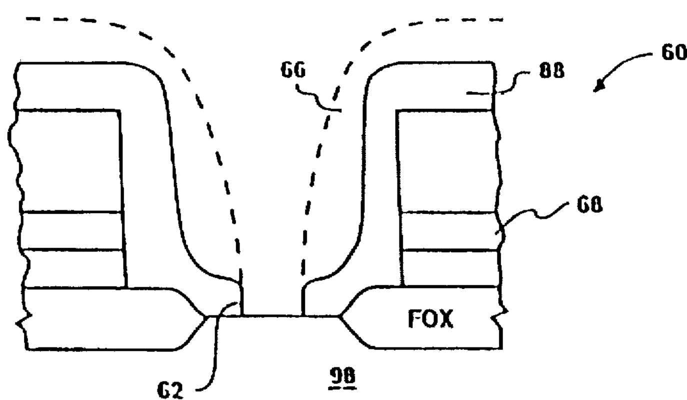

FIG. 3D depicts how spacer layer 66 is completely removed after being isotropically etched, and sublithographic buried contact opening 62 communicates with substrate 98 through insulator layer 88. Spacer layer 66 is shown in phantom to depict its previous existence, and accordingly, FIG. 3D is representative of FIG. 2B.

Figure 5:
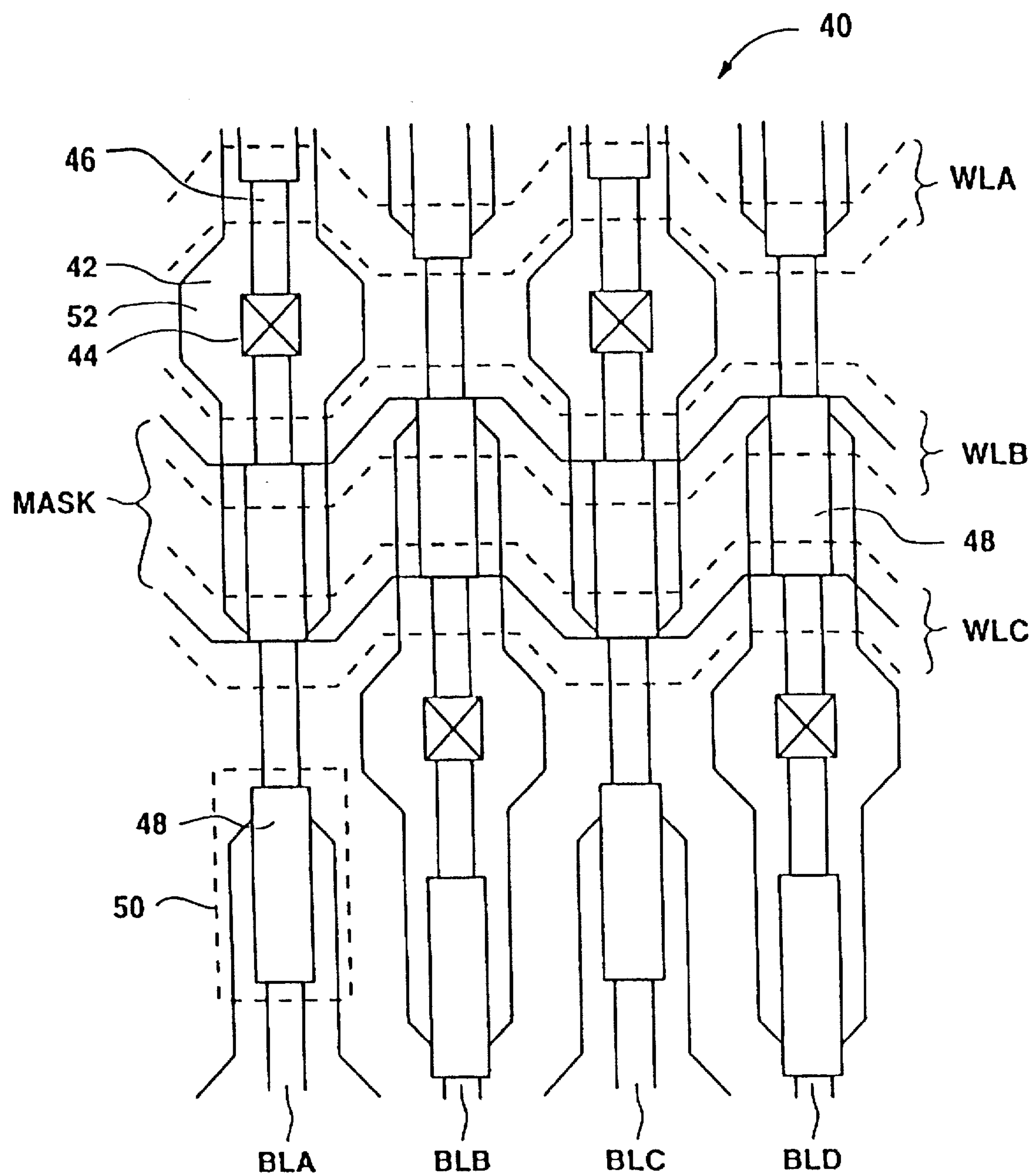
FIG. 5 is a plan view of a multicell DRAM layout depicting masking options for use in the present invention process.

FIG. 5 is a plan view of a layout of multiple DRAM and capacitor cells 40 incorporating the present invention wherein masking options are identified. For clarity, not all the elements of each cell are included in each cell. In this figure, there are four vertically running bitlines: BLA, BLB, BLC, and BLD, and three (phantom) wordlines: WLA, WLB, and WLC, that zigzag horizontally across the figure. Bitlines connect to active areas (source or drain) 42 at each of the contacts 44 (squares). The wordlines WLA, WLB, and WLC connect to gate areas 46. The cell buried contact 48 is the rectangle above and below each of the bitline squares 44. Although the buried contact and storage plate 48 appear rectangular in this drawing, they would typically be more of an oval shape. The larger rectangles 50 (in dotted lines) are the storage plates which completely cover the buried contact. The top plate layer (not shown) covers the entire surface except for octagonal opening 52 around each of the bitline contacts 44.

FIG. 5 demonstrates how a single continuous mask opening is implemented according to the present invention to create the plurality of buried contacts. A single opening in a mask runs parallel to each depicted wordline WLA-C in order to etch the buried contacts. A single, continuous opening in a mask is usable because the present invention spacer layer is thicker at the minimum width points between adjacent parallel word lines than at the locations where the buried contacts are formed. The difference in spacer layer thickness allows for the use of the single opening in the mask and allows for complete etching at the buried contact locations but only partial etching elsewhere along the word lines.

Alternately, a traditional mask could be used wherein each and every buried contact location is singularly and separately defined in the mask.

Figure 6:
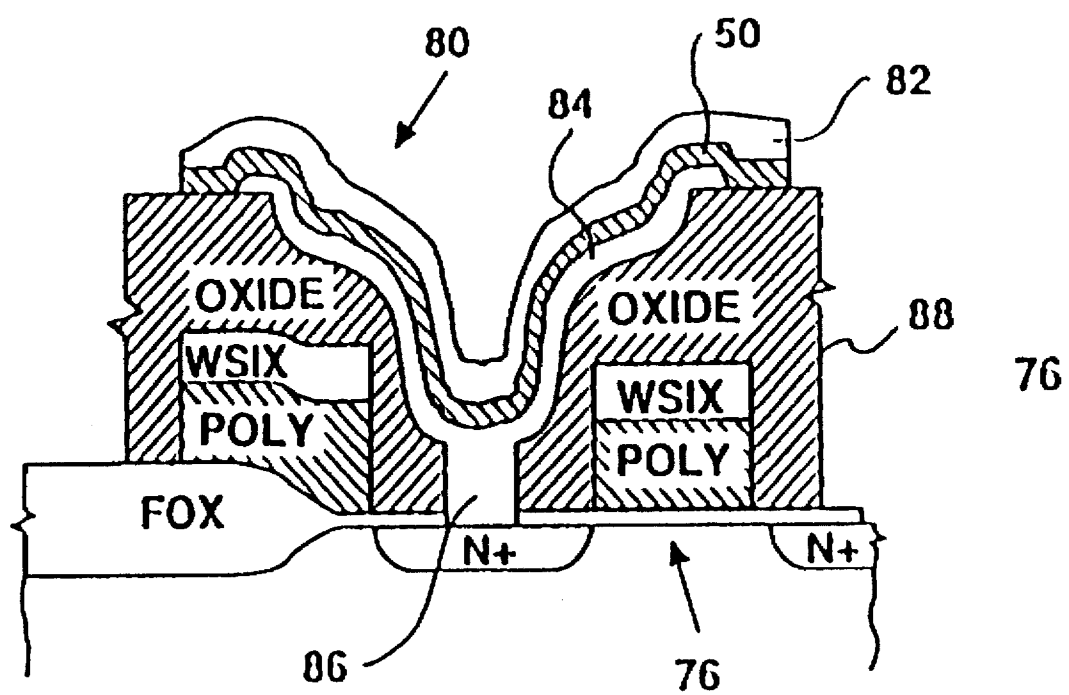
FIG. 6 is a cross-section of the present invention after forming a capacitor over the buried contact.

FIG. 6 illustrates transistor 76 and capacitor 80 after depositing and patterning dielectric layer 50 and top plate 82 over storage plate 84 and buried contact 86. A typical dielectric material is a silicon nitride, and the top plate is a third layer of polysilicon. Buried contact 86 is sublithographic according to principles of the present invention and provides the advantages over the prior art as previously described herein.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of forming a sublithographic buried contact on a semiconductor device comprising:

forming a plurality of transistor gate structures and word lines adjacent a buried contact area on a substrate, the word lines defining a first gap between word lines peripheral to the buried contact and a second gap between word lines over the buried contact, which second gap is wider than the first gap;

depositing an insulator layer over and adjacent the gate structures, word lines, buried contact area, and substrate;

depositing a removable spacer layer over the insulator layer to substantially fill the first gap, to partially fill the second gap, and to define a sublithographic dimension between removable spacer walls over the buried contact area, the removable spacer walls being formed by the removable spacer layer adjacent the gate structures;

patterning the buried contact area in the removable spacer layer;

anisotropically removing portions of the removable spacer layer and the insulator layer to form the buried contact sublithographically in at least a dimension parallel to the word lines; and further removing the remainder of the removable spacer layer.

2. The method as recited in claim 1 wherein the insulator layer is an oxide deposited by a tetraethyl orthosilicate (TEOS) process.

3. The method as recited in claim 1 wherein the removable spacer layer is selected from the group consisting of ozone tetraethyl orthosilicate ($O_3$TEOS), polysilicon, and silicon nitride.

4. The method as recited in claim 1 wherein the removable spacer layer is deposited at a thickness of substantially one-half a width of the first gap.

5. The method as recited in claim 1 wherein the removable spacer layer is of a lesser thickness over the buried contact area than over the first gap.

6. The method as recited in claim 1 further including patterning a plurality of buried contact areas defined by a plurality of singular, discrete openings in a mask pattern.

7. The method as recited in claim 1 further including patterning a plurality of buried contact areas defined by a singular, continuous opening in a mask pattern.

8. The method as recited in claim 1 wherein the anisotropically removing portions of the removable spacer layer and insulator layer etching to form the buried contact includes an anisotropical etch.

9. The method as recited in claim 1 wherein said anisotropic removal is continuous, parallel to the word lines communicating with the buried contact area and forms the buried contact forms only at the buried contact area.

10. The method as recited in claim 1 wherein further removing to completely remove the removable spacer layer includes an etch.

11. The method as recited in claim 10 wherein the etch comprises dipping the semiconductor device in hydrofluoric acid.

12. A method of forming a connection to a semiconductor wafer having transistor gate structures thereon, the transistor gate structures being formed to define a first gap and a second gap between the gate structures, which second gap overlies a location defined for the connection and is wider than the first gap, the method comprising:

depositing an insulator over the wafer and gate structures;

depositing a removable spacer over the insulator to substantially fill the first gap and to partially fill the second gap with the removable spacer, a thickness of the removable spacer in the first gap being greater than a thickness of the removable spacer in the second gap;

patterning the connection in the removable spacer;

anisotropically removing portions of the removable spacer and insulator to form the connection sublithographically in at least a dimension parallel to the gate structure; and completely removing the remainder of the removable spacer.

13. The method as recited in claim 12 wherein the removable spacer is of a substantially lesser thickness over the connection than over other areas of the insulator layer.

14. The method as recited in claim 12 wherein the anisotropically removing portions of the removable spacer and insulator to form the connection includes an anisotropical etch.

15. The method as recited in claim 12 wherein the completely removing the remainder of the removable spacer includes an isotropical etch.

16. A method of forming a buried contact to a semiconductor DRAM substrate comprising:

forming a plurality of transistor gate structures and word lines, the word lines having a first gap between word lines peripheral to the buried contact and a second gap between word lines over the buried contact, which second gap is wider than the first gap;

depositing an insulating oxide by a tetraethyl orthosilicate process over and adjacent to the gate structures and word lines;

depositing a removable ozone tetraethyl orthosilicate ($O_3$TEOS) spacer layer over said insulating oxide to substantially fill the first gap and to partially fill the second gap with the removable spacer layer;

patterning a buried contact area in the removable spacer layer with a continuous pattern in a direction parallel to the word lines adjacent the buried contact area;

anisotropically removing the removable spacer layer and the insulating oxide to form the buried contact sublithographically in at least a dimension parallel to the word lines; and isotropically removing remaining portions of the removable spacer layer.

17. The method as recited in claim 12 wherein the removable spacer is selected from the group consisting of ozone tetraethyl orthosilicate ($O_3$TEOS), polysilicon, and silicon nitride.

18. The method as recited in claim 12 wherein the removable spacer is deposited at a thickness of substantially one-half of a width of the first gap.

19. The method as recited in claim 12 further including patterning a plurality of connections defined by a plurality of singular, discrete openings in a mask pattern.

20. The method as recited in claim 12 further including patterning a plurality of connections defined by a singular, continuous opening in a mask pattern.

21. The method as recited in claim 12 wherein said anisotropic removal is continuous and parallel to the first and second gaps and wherein the connection forms only at the second gap.

* * * * *